United States Patent [19]

Okutsu et al.

[11] Patent Number: 4,863,830

[45] Date of Patent: Sep. 5, 1989

[54] PROCESS FOR HARD TONE DEVELOPMENT OF SILVER HALIDE PHOTOGRAPHIC LIGHT-SENSITIVE MATERIAL

[75] Inventors: Eiichi Okutsu; Kazumi Watase, both of Kanagawa, Japan

[73] Assignee: Fuji Photo Film Co., Ltd., Kanagawa, Japan

[21] Appl. No.: 225,665

[22] Filed: Jul. 29, 1988

Related U.S. Application Data

[63] Continuation of Ser. No. 723,416, Apr. 15, 1985, abandoned.

[30] Foreign Application Priority Data

Apr. 16, 1984 [JP] Japan .................................. 59-76163

[51] Int. Cl.[4] ......................... G03C 5/30; G03C 5/26; G03F 7/06

[52] U.S. Cl. .................................... 430/264; 430/268; 430/436; 430/438; 430/441; 430/446; 430/486; 430/487; 430/490

[58] Field of Search ................................ 430/264–268, 430/949, 486, 487–493, 436, 438, 441, 446, 448

[56] References Cited

U.S. PATENT DOCUMENTS 3,333,959 8/1967 Hayakawa ........................... 430/949

3,345,175 10/1967 Hayakawa ........................... 430/949

4,269,929 5/1981 Nothnagle ........................... 430/265

FOREIGN PATENT DOCUMENTS 0023465 10/1965 Japan .

*Primary Examiner*—Richard L. Schilling

*Attorney, Agent, or Firm*—Sughrue, Mion, Zinn, Macpeak & Seas

[57] ABSTRACT

A process for hard tone development of a silver halide photographic light-sensitive material is described, comprising developing an imagewise exposed negative type silver halide photographic light-sensitive material in the presence of hydrazine, usig a developing solution comprising (1) a developing agent, (2) 0.25 mol/l or more of sulfite and (3) a compound represented by the general formula (I) and having a pH value of 10.5 to 12.3:

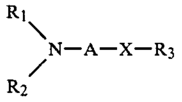

(I)

wherein $R_1$ and $R_2$ represent each an alkyl group of $R_1$ and $R_2$ may form a ring by linking each other, $R_3$ represents an alkyl group, an aryl group or a heterocyclic group, and $R_1$, $R_2$ and $R_3$ may have substituents, A represents an alkylene group which may be substituted, and X represents —CONH—, —OCONH—, —NHCONH—, —NHCOO—, —COO—, —OCO—, —CO—, —NHCO—, $—SO_2NH—$, $—NHSO_2—$, $—SO_2—$or —O—.

17 Claims, No Drawings

PROCESS FOR HARD TONE DEVELOPMENT OF SILVER HALIDE PHOTOGRAPHIC LIGHT-SENSITIVE MATERIAL

This is a continuation of application Ser. No. 723,416 filed Apr. 15, 1985, now abandoned.

FIELD OF THE INVENTION

The present invention relates to a process for development of a silver halide photographic light-sensitive material and particularly to a process for development of a plate making silver halide photographic light-sensitive material capable of stably obtaining a superhard tone image suitable for a photo-engraving process for graphic arts.

BACKGROUND OF THE INVENTION

In the field of graphic arts, an image forming system showing superhard tone photographic characteristics is required for improving the reproduction of images having continuous gradation with halftone images or the reproduction of line drawing images.

For such a purpose, a special developing solution called a litho-developing solution has been used hitherto. The litho-developing solution contains only hydroquinone as a developing agent, wherein sulfite, which is a preservative, is used in a state of an adduct of formaldehyde so as not to hinder infectious developability of the developing agent and the concentration of free sulfite ion is very low. Therefore, the litho-developing solution has a serious disadvantage in that it cannot be preserved over 3 days, because it is easily subject to air oxidation.

As a process of obtaining superhard tone photographic characteristics with a stabilized developing solution, there is a process using hydrazine derivatives described in U.S. Pat. Nos. 4,224,401, 4,168,977, 4,166,742, 4,311.781, 4,272,606, 4,221,857 and 4,243,739. According to this process, superhard tone photographic characteristics are obtained in high sensitivity. Further, since it is possible to add a high concentration of sulfite to the developing solution, the stability of the developing solution to air oxidation is remarkably improved as compared with the litho-developing solution.

U.S. Pat. No. 4,269,929 has disclosed a process of hard tone development which comprises bringing a photographic element having at least a silver halide emulsion layer in contact with an alkali developing solution having a pH value of 10 to 12 which contains a dihydroxybenzene developing agent, a 3-pyrazolidone developing agent, a sulfite preservative and an amino compound in an amount for accelerating contrast, in the presence of hydrazine derivatives. It has been described that, according to this process of hard tone development, the amino compound employed in an amount for accelerating contrast not only maintains hard tone characteristics but also can improve the stability of the developing solution to air oxidation because the hard tone development characteristics are obtained even if the pH of the developing solution is reduced. It has been described in the Examples thereof that such effects are obtained with 3-diethylamino-1-propanol, 2-methylamino-1-ethanol, 2-diethylamino-2-ethanol, diisopropylamine, 5-amino-1-pentanol and 6-amino-1-hexanol, etc.

However, since such amino compounds are used in an amount of 10 g to 200 g per liter of the developing solution, there are problems that the chemical cost of the developing solution becomes high and dissolution of the silver halide occurs due to the presence of a large amount of the amino compound.

The fact that the amino compound in the developing solution dissolves silver halide has been described in C. E. K. Mees, *The Theory of the Photographic Process*, 3rd Edition, page 370, and L. F. A. Mason, Photographic Processing Chemistry, page 43. Thus, it is not desirable to employ a large amount of a compound which dissolves silver halide in the developing solution. For example, in a process which comprises developing a silver halide photographic light-sensitive material by an automatic developing apparatus, wherein a supplementary liquid is supplied to a development tank according to the area of the film, as is conventionally used in this field of the art, if the developing solution as described above is used for a long period of time, a phenomenon that silver halide eluted from the film adheres as silver to the wall of the tank in the automatic developing apparatus or rollers conveying the film occurs. The silver adhering to the rollers is transferred to the film to cause silver stain on the films, whereby the quality of image is remarkably reduced. The silver stain is formed on both of the high density part having a large rate of dot area and the low density part having a low rate of dot area, but silver stain on the low density part is particularly visually conspicuous.

SUMMARY OF THE INVENTION

Accordingly, an object of the present invention is to provide a process of development by which superhard tone caused by hydrazines is realized with a stabilized developing solution having a low pH value without causing silver stain.

The object of the present invention has been attained by developing an exposed negative type silver halide photographic light-sensitive material in the presence of hydrazines with a developing solution containing at least (1) a developing agent, (2) 0.25 mol/l or more of sulfite and (3) a specified amino compound represented by the following general formula (I) and having a pH value of 10.5 to 12.3.

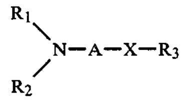

(I)

In the formula, $R_1$ and $R_2$ represents each an alkyl group or $R_1$ and $R_2$ may form a ring by linking each other. $R_3$ represents an alkyl group, an aryl group or a heterocyclic group. $R_1$, $R_2$ and $R_3$ may have substituents. A represents an alkylene group which may be substituted. X represents —CONH—, —OCONH—, —NHCONH—, —NHCOO—, —COO—, —OCO—, —CO—, —NHCO—, —$SO_2$NH—, —NH$SO_2$—, —$SO_2$—or —O—.

DETAILED DESCRIPTION OF THE INVENTION

As the alkyl groups of $R_1$ and $R_2$, lower alkyl groups are preferred, and a methyl group, an ethyl group, etc., are particularly preferred. As the rings formed by linking $R_1$ to $R_2$, 5-member or 6-member saturated rings including the nitrogen atom are preferred. For example, there are a pyrrolidine ring and a tetrahydropyridine ring.

As the alkyl groups of $R_3$, lower alkyl groups are preferred, and a methyl group, an ethyl group, etc., are particularly preferred. As the aryl groups of $R_3$, monocyclic aryl groups are preferred. For example, there are a phenyl group, a tolyl group, etc. As the heterocyclic groups of $R_3$, 5-member or 6-member heterocyclic groups containing a nitrogen atom are preferred. As $R_3$, an alkyl group or an aryl group is preferred.

As the alkylene groups of A, those having 5 or less carbon atoms are preferred. They may have substituents such as a hydroxyl group, a carboxyl group, a sulfo group, etc.

Particularly preferred examples of $R_1$ and $R_2$ are a methyl group and an ethyl group, particularly preferred examples of $R_3$ are a methyl group, an ethyl group, a phenyl group and a tolyl group, particularly preferred examples of A are alkylene groups having 4 or less carbon atoms which may be substituted with a hydroxyl group, and particularly preferred examples of X are $-NHCONH-$, $-NHCOO-$, $-SO_2NH-$, $-SO_2-$ and $-O-$.

As examples of compounds represented by the general formula (I), there are the following. However, the present invention is not limited to these compounds.

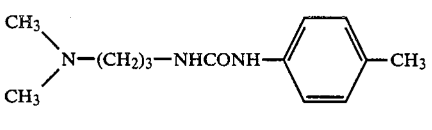
(I-1)

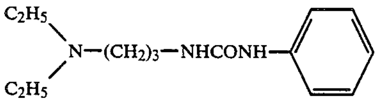
(I-2)

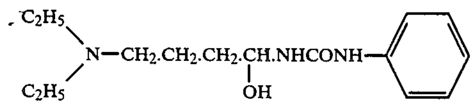
(I-3)

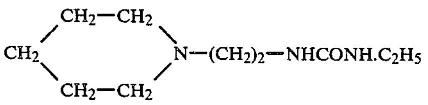
(I-4)

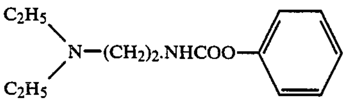
(I-5)

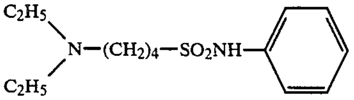
(I-6)

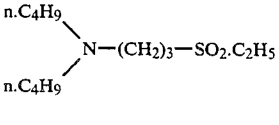
(I-7)

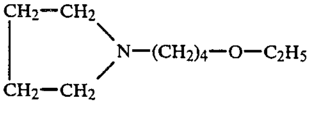
(I-8)

The compound of the present invention represented by the general formula (I) is used in an amount of 0.1 g to 10 g per liter of the developing solution, by which the desired object is attained. A preferred amount to be added is in a range of 0.5 to 3 g per liter of the developing solution.

It has been described in Japanese Patent Publication No. 23465/65 that the compound represented by the general formula (I) can be used as a development accelerator in litho-development (infectious development) by which hard toning is attained by a development inhibiting effect due to a polyoxyethylene compound, by incorporating it in a silver halide light-sensitive material. However, in the case of the present invention, wherein hydrazines are present, it is an unexpected matter that the sensitization hard toning effect is accelerated by adding the compound represented by the general formula (I) to the developing solution.

Developing agents used in the developing solution used in the present invention are not particularly restricted. However, it is preferable to contain dihydroxybenzenes because of easily obtaining good quality of halftone. Combinations of dihydroxybenzenes and 1-phenyl-3-pyrazolidones are further preferred in view of development capacity.

As dihydroxybenzene developing agents used in the present invention, there are hydroquinone, chlorohydroquinone, bromohydroquinone, isopropylhydroquinone, methylhydroquinone, 2,3-dichlorohydroquinone, 2,5-dichlorohydroquinone, 2,3-dibromohydroquinone and 2,5-dimethylhydroquinone, etc., but hydroquinone is particularly preferred.

As 1-phenyl-3-pyrazolidone derivatives used in the present invention as the developing agents, there are 1-phenyl-3-pyrazolidone, 1-phenyl-4,4-dimethyl-3-pyrazolidone, 1-phenyl-4-methyl-4-hydroxymethyl-3-pyrazolidone, 1-phenyl-4,4-dihydroxymethyl-3-pyrazolidone, 1-phenyl-5-methyl-3-pyrazolidone, 1-p-aminophenyl-4,4-dimethyl-3-pyrazolidone and 1-p-tolyl-4,4-dimethyl-3-pyrazolidone, etc.

The developing agents are preferred to be used generally in an amount of 0.05 mol/l to 0.8 mol/l. In the case of using a combination of dihydroxybenzenes and 1-phenyl-3-pyrazolidones, it is preferred that the former is used in an amount of 0.05 mol/l to 0.5 mol/l and the latter is used in an amount of 0.06 mol/l or less.

As preservatives of sulfites used in the present invention, there are sodium sulfite, potassium sulfite, lithium sulfite, ammonium sulfite, sodium bisulfite, potassium metabisulfite and formaldehydesodium bisulfite. The sulfite is used in an amount of 0.25 mol/l or more, particularly 0.3 mol/l or more. However, it is desirable that the least upper bound is 1.2 mols/l, because the sulfite precipitates in the developing solution to cause pollution of the solution if too much an amount of it is added.

The pH of the developing solution of the present invention is set in a range of 10.5 to 12.3, preferably 11.0 to 12.0. As alkali agents used for setting the pH, conventional water-soluble inorganic alkali metal salts (for example, sodium hydroxide, sodium carbonate, potassium tertiary phosphate, etc.) can be used.

The developing solution according to the present invention is characterized by containing a developing agent, a sulfite preservative in an amount of at least 0.25 mol/l and a compound represented by the above-described general formula (I). Except the abovedescribed characteristics, it is the same developing solution as the conventional silver halide photographic developing solution. As additives other than the abovedescribed components, it may contain pH controlling agents or buffer agents such as boric acid, borax, sodium hydroxide, potassium hydroxide, sodium carbonate, potassium carbonate, sodium tertiary phosphate or potassium tertiary phosphate; development restrainers such as sodium bromide, potassium bromide or potassium iodide; organic solvents such as ethylene glycol, diethylene glycol, triethylene glycol, dimethylformamide, methyl cellosolve, hexylene glycol, ethanol or methanol; and antifogging agents or black pepper preventing agents such as mercapto compounds such as 1-phenyl-5-mercaptetrazole or sodium 2-mercaptobenzimidazole-5-sulfonate, indazole compounds such as 5-nitroindazole, etc., or benzotriazole compounds such as 5-methylbenzotriazole, etc. If necessary, it may contain toning agents, surface active agents, defoaming agents, water softeners, hardeners and amino compounds described in Japanese Patent Application (OPI) No. 106244/81 (corresponding to U.S. Pat. No. 4,269,929) (the term "OPI" as used herein refers to a "published unexamined Japanese patent application open to public inspection").

As a fixing solution, that having a composition conventionally used can be used. As fixers, organic sulfur compounds which are known to have an effect of fixers can be used in addition to thiosulfates and thiocyanates. The fixing solution may contain water-soluble aluminum salts as hardeners. Further, as oxidizing agents, trivalent iron compounds can be used as complexes of ethylenediaminetetraacetic acid.

The temperature of development processing is selected between 18° C. and 50° C., preferably between 25° C. and 43° C.

The development process of the present invention is suitable for rapid processing using, particularly, an automatic developing apparatus. As the automatic developing apparatus, any of a roller conveyor type apparatus, a belt conveyor type apparatus and others can be used. The processing time may be short, and it is a total of 2 minutes or less, particularly, 100 seconds or less. The effect is sufficiently shown in the case of rapid processing wherein time allotted to development is 15 seconds to 60 seconds.

According to the process for development of the present invention, it is not necessary to carry out complicated control of the solution and constant photographic characteristics of superhard tone and high sensitivity are always obtained by merely supplying according to the processing area of the light-sensitive material.

As hydrazines used in the development process of the present invention, there are hydrazine sulfate, hydrazine hydrochloride, etc., and, preferably, hydrazines described in U.S. Pat. Nos. 4,224,401, 4,243,739, 4,272,614, 4,385,108, 4,269,929 (hydrazines described as those suitable for using in light-sensitive materials), and 4,323,643, etc.

These hydrazines may be allowed to exist in the developing solution or may be added to an emulsion layer of the light-sensitive material or a hydrophilic colloid layer adjacent to it. The amount in the case of using in the developing solution is in a range of 5 mg to 5 g/l, particularly 10 mg to 1 g/l, and that in the case of adding to the light-sensitive material is in a range of $10^{-6}$ mol to $5\times10^{-2}$ mol, particularly $10^{-5}$ mol to $2\times10^{-2}$ mol, per mol of silver.

In particularly preferred embodiments of the present invention, hydrazine derivatives represented by the general formula (II) are added to an emulsion layer of the light-sensitive layer or a hydrophilic colloid layer adjacent to it.

$$R^4—NHNH—G—R^5 \quad (II)$$

In the formula, $R^4$ represents an aliphatic group or an aromatic group; $R^5$ represents a hydrogen atom, a substituted or unsubstituted alkyl group, a substituted or unsubstituted aryl group, a substituted or unsubstituted alkoxy group or a substituted or unsubstituted aryloxy group; and G represents a carbonyl group, a sulfonyl group, a sulfoxy group, a phosphoryl group or an Nsubstituted or unsubstituted iminomethylene group.

In the general formula (II), the aliphatic group represented by $R^4$ is preferably a straight chain, branched chain or cyclic alkyl group having 1 to 30 carbon atoms, particularly, 40 to 20 carbon atoms. The branched chain alkyl group may be cyclized so as to form a saturated heterocycle containing one or more hetero atoms. Further, the alkyl group may have various kinds of substituents, such as an aryl group, an alkoxy group, a sulfonamide group, an acylamino group or a combination thereof.

In the general formula (II), the aromatic group represented by $R^4$ is a monocyclic or bicyclic aryl group or unsaturated heterocyclic group. The unsaturated heterocyclic group may form a hetero aryl group by condensing to a monocyclic or bicyclic aryl group. The aromatic group represented by $R^4$ may have substituents and has, preferably, 30 or less carbon atoms (including carbon atoms of substituents, if present). Examples of preferred substituents include straight chain, branched chain or cyclic alkyl groups, alkoxy groups, substituted amino groups, acylamino groups, sulfonamide groups, thiourea groups, thioamide groups, groups having a carbon-nitrogen double bond

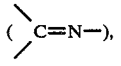

heterocyclic groups and combinations of them. Details of these substituents have been described in Japanese Patent Application (OPI) No. 129436/82 (corresponding to U.S. Pat. No. 4,429,036).

As $R^4$ in the general formula (II), substituted or unsubstituted aryl groups are most suitable in light of the purpose of the present invention.

In the general formula (II), the alkyl group represented by $R^5$ is preferably an alkyl group having 1 to 4 carbon atoms which may have substituents such as a halogen atom, a cyano group, a carboxyl group, a sulfo group, an alkoxy group, a phenyl group, etc.

In the general formula (II), the aryl group which may be substituted, represented by $R^5$, is a monocyclic or bicyclic aryl group, for example, that containing a benzene ring. This aryl group may be substituted by, for example, a halogen atom, an alkyl group, a cyano group, a carboxyl group, a sulfo group, etc.

In the general formula (II), the alkoxy group which may be substituted, represented by $R^5$, is an alkoxy group having 1 to 8 carbon atoms which may be substituted by a halogen atom, an aryl group, etc.

In the general formula (II), the aryloxy group which may be substituted, represented by $R^5$, is preferably a monocyclic group. As substituents, there are halogen atoms and others.

In the case that G represents a carbonyl group, examples of suitable groups represented by $R^5$ include a hydrogen atom, a methyl group, a methoxy group, an ethoxy group and a substituted or unsubstituted phenyl group, and a hydrogen atom is particularly preferred.

In the case that G represents a sulfonyl group, examples of $R^5$ include a methyl group, an ethyl group, a phenyl group and a 4-methylphenyl group, and a methyl group is particularly preferred.

In the case that G represents a phosphoryl group, suitable examples of $R^5$ include a methoxy group, an ethoxy group, a butoxy group, a phenoxy group and a phenyl group, and a phenoxy group is particularly preferred.

In the case that G represents a sulfoxy group, suitable examples of $R^5$ include a cyanobenzyl group, a methylthiobenzyl group, etc. In the case that G represents an N-substituted or unsubstituted iminomethylene group, suitable examples of $R^5$ include a methyl group, an ethyl group and a substituted or unsubstituted phenyl group.

$R^4$ or $R^5$ in the general formula (II) may be that in which a ballast group ordinarily used in immobile photographic additives such as couplers, etc., may be incorporated. The ballast group is a group having 8 or more carbon atoms which is comparatively inactive to photographic properties, which can be selected from, for example, alkyl groups, alkoxy groups, phenyl groups, alkylphenyl groups, phenoxy groups and alkylphenoxy groups.

$R^4$ or $R^5$ in the general formula (II) may be that in which a group of enhancing adsorption to the surface of silver halide grains is incorporated. As such adsorptive groups, there are groups described in U.S. Patent 4,385,108 such as thiourea groups, heterocyclic thioamide groups, mercapto heterocyclic groups, triazole groups, etc.

As G in the general formula (II), a carbonyl group is the most suitable group.

In the following, examples of compounds represented by the general formula (II) are described. However, the present invention is not limited to the following compounds.

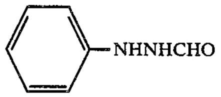
II-1

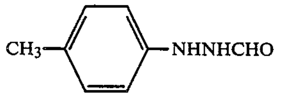
II-2

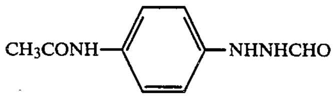
II-3

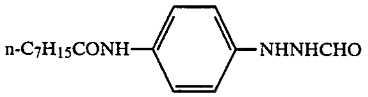
II-4

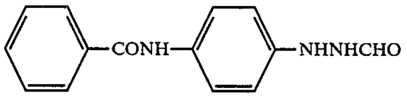
II-5

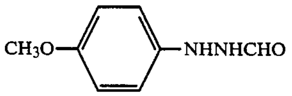
II-6

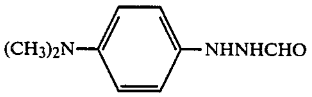
II-7

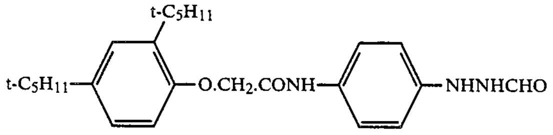
II-8

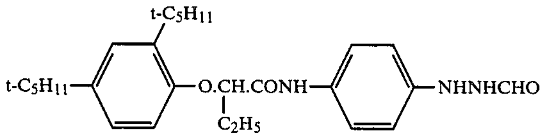
II-9

-continued
II-10
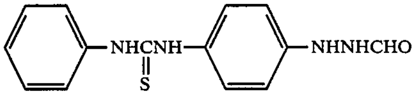
II-11
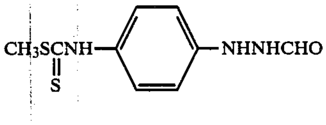
II-12
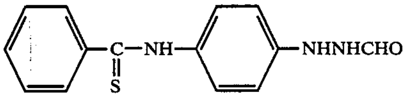
II-13
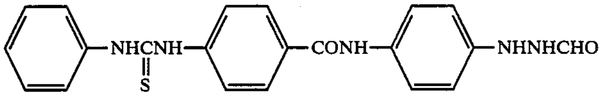
II-14
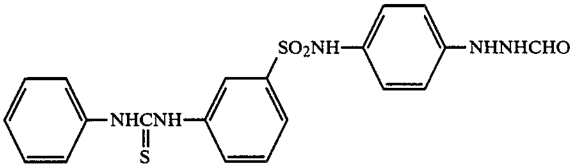
II-15
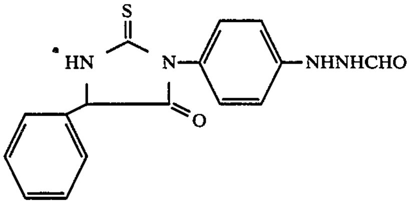
II-16
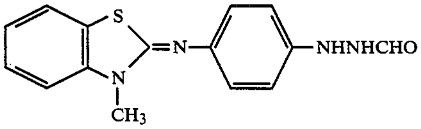
II-17
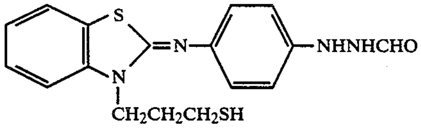
II-18
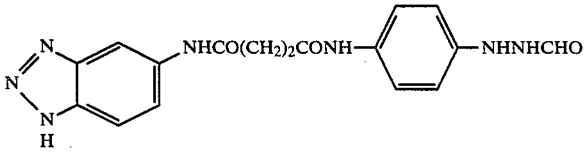
II-19
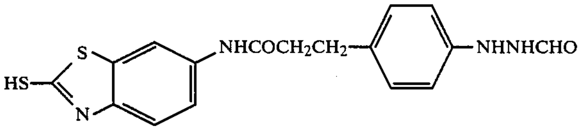
II-20
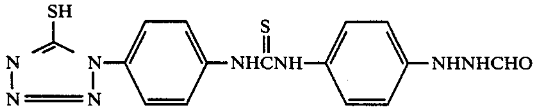

-continued
II-21
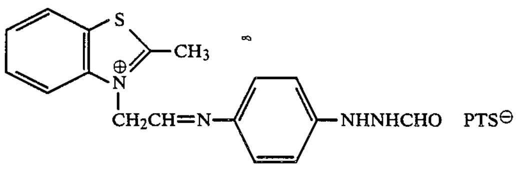
II-22
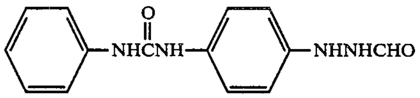
II-23
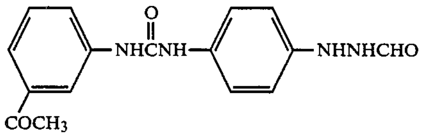
II-24
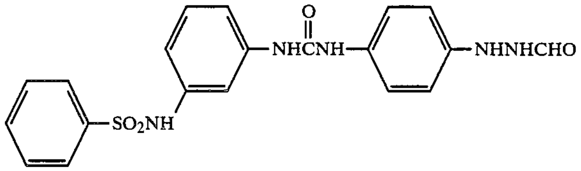
II-25
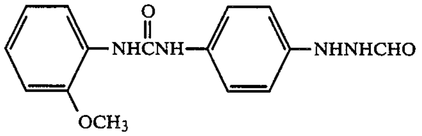
II-26
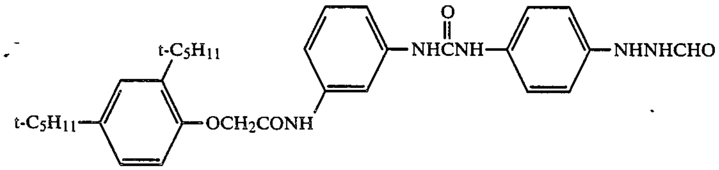
II-27
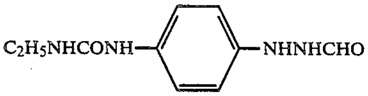
II-28
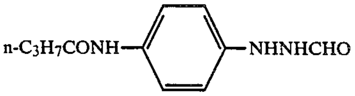
II-29
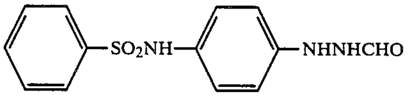
II-30
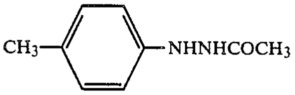
II-31
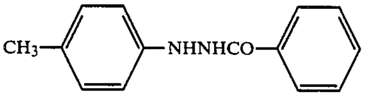

-continued
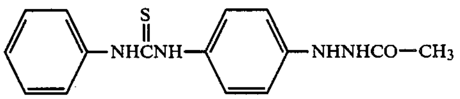
II-32
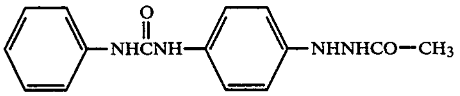
II-33
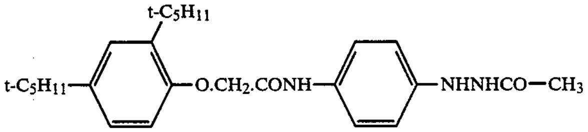
II-34
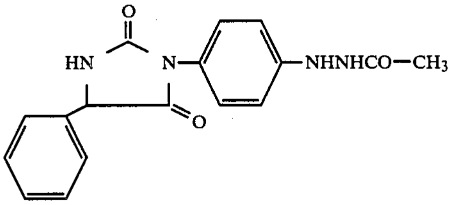
II-35
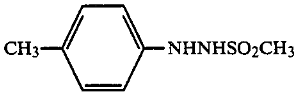
II-36
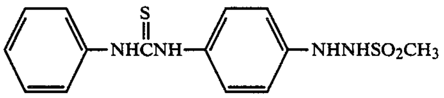
II-37
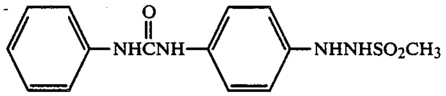
II-38
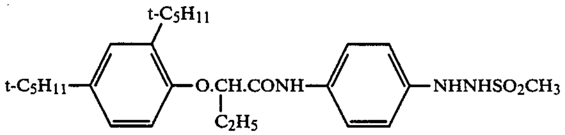
II-39
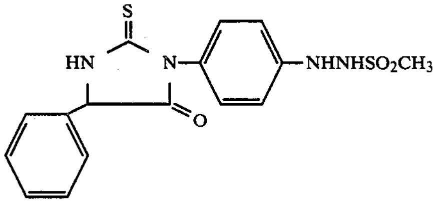
II-40
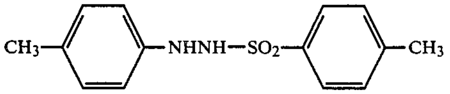
II-41
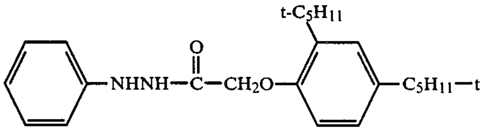
II-42

-continued
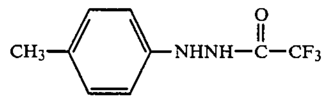
II-43
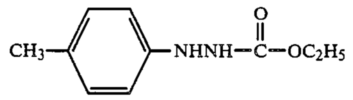
II-44
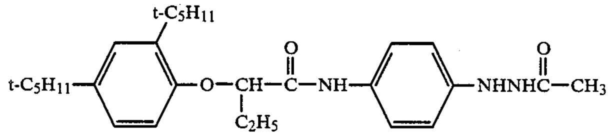
II-45
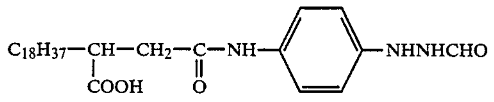
II-46
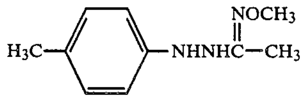
II-47
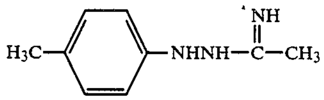
II-48
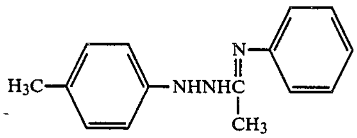
II-49
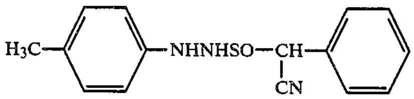
II-50
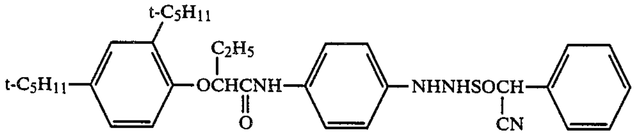
II-51
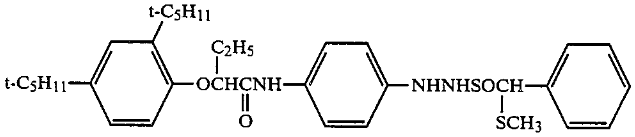
II-52
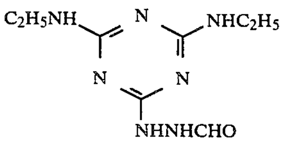
II-53
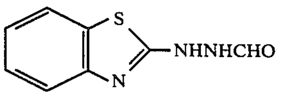
II-54

-continued
II-55
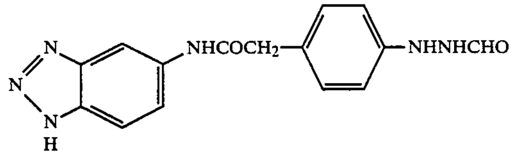
II-56
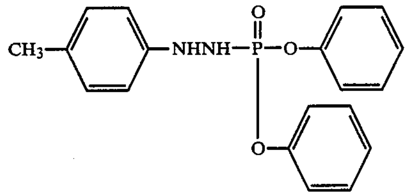
II-57
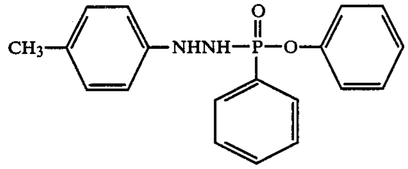
$n\text{-}C_{12}H_{25}$—NHNHCHO II-58
II-59
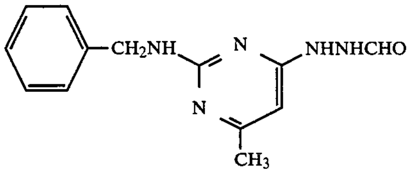
II-60
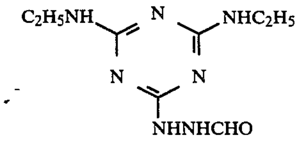
II-61
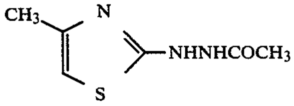
II-62
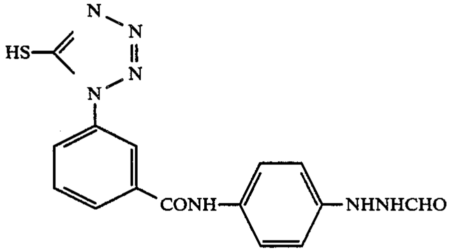
II-63
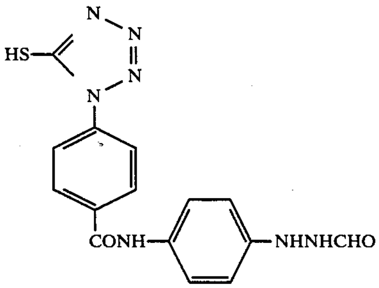

-continued

II-64

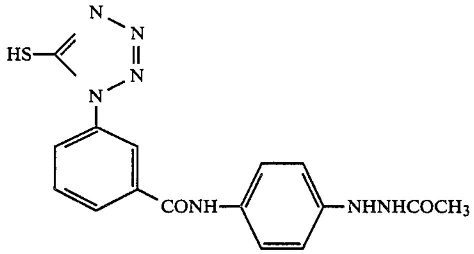

The process for producing the hydrazine derivatives represented by the general formula (II) is described, for example, in U.S. Pat. Nos. 4,224,401, 4,243,739, 4,272,614, 4,323,543.

In the present invention, in order to incorporate the compounds represented by the general formula (II) in the photographic light-sensitive materials, they are added as a solution in an organic solvent compatible with water, such as alcohols (for example, methanol, ethanol), esters (for example, ethyl acetate) or ketones (for example, acetone) or as an aqueous solution in the case of water-soluble compounds, to hydrophilic colloid solutions.

In the case of adding it to photographic emulsions, the addition may be carried out at an arbitrary time from the beginning of chemical ripening to before coating, but it is preferred to carry it out after conclusion of chemical ripening.

In the following, silver halide photographic light-sensitive materials to which the image formation process of the present invention is applied are illustrated.

Negative type silver halide light-sensitive materials used in the present invention are those having at least one emulsion layer composed of a substantial surface latent image type silver halide emulsion. A substantial surface latent image type silver halide emulsion means a silver halide emulsion of the type where the latent image is formed on mainly the surface of grains, which has properties opposed to those of an inner latent image type silver halide emulsion. In greater detail, it is the emulsion defined by the test described in U.S. Pat. No. 4,224,401.

The halide composition of the silver halide emulsion to be used is not restricted, and any composition of silver chloride, silver chlorobromide, silver iodobromide, silver iodobromochloride, etc., may be used.

It is preferred that silver iodide content is 5% by mol or less, preferably 3% by mol or less.

Silver halide grains in the photographic emulsion used in the present invention can have a comparatively wide distribution of particle size, but it is preferred to have a narrow distribution of particle size. It is particularly preferred that grains of 90% of the whole relating to weight or number of silver halide grains have a particle size within ±40% of the average particle size. (Generally, such an emulsion is called monodisperse emulsion.)

The silver halide grains used in the present invention are preferable to be fine grains (for example, 0.7 μm or less). Particularly, those having a size of 0.4 μm or less are preferred.

Silver halide grains in the photographic emulsions may have a regular crystal form such as cube or octahedron, or may have an irregular crystal form such as sphere or plate, or a mixed crystal form thereof. They may be composed of a mixture of grains having different crystal forms.

The inner part and the surface layer of silver halide grains may be composed of the same phase or may be composed of different phases.

Two or more silver halide emulsions prepared separately may be mixed to use.

During the process of formation or physical ripening of silver halide grains, cadmium salts, zinc salts, lead salts, thallium salts, iridium salts or complex salts thereof, rhodium salts or complex salts thereof, iron salts or complex salts thereof, etc., may be allowed to coexist in silver halide emulsions used in the present invention.

Use of rhodium salts or complex salts thereof is particularly preferred because of showing an effect of further enhancing rapid processing aptitude. As typical rhodium salts, rhodium chloride, rhodium trichloride, rhodium ammonium chloride, etc., are used, but complex salts can be used. Rhodium salts may be added prior to the conclusion of the first ripening in preparation of emulsions, but they are particularly desired to be added during formation of grains. The amount of them to be added is in a range of $1\times10^{-8}$ to $8\times10^{-6}$ mol per mol of silver, and a range of $1\times10^{-7}$ mol to $5\times10^{-6}$ mol is particularly preferred.

If the rhodium salt is added to silver halide emulsions, the emulsions cause deterioration of sensitivity simultaneously with hard toning. However, in the emulsions of the present invention, there is a characteristic that the sensitivity is recovered by the abovedescribed compound represented by the general formula (II) and, at the same time, remarkable hard tone is attained.

As a binder or protective colloid for photographic emulsions, gelatin is advantageously used, but other natural or synthetic hydrophilic colloids can be used, too.

As gelatin, acid-processed gelatin may be used as well as lime-processed gelatin, and hydrolyzed products and enzyme-decomposed products of gelatin can be used, too.

After formation of precipitates or physical ripening, soluble salts are generally removed from the emulsions. As a means for such a purpose, a noodle water wash process known hitherto, in which gelatin is gelled, may be used. A sedimentation (flocculation) process utilizing inorganic salts composed of polyvalent anion, for example, sodium sulfate, anionic surface active agents, anionic polymers (for example, polystyrenesulfonic acid) or gelatin derivatives (for example, aliphatically acylated gelatin, aromatically acylated gelatin, aromatically carbamoylated gelatin, etc.) may be used. The process of removing soluble salts may be omitted.

The silver halide emulsions used in the process of the present invention may be used without chemical sensitization, but they are preferred to be chemically sensitized. As methods of chemical sensitization of silver halide emulsions, sulfur sensitization, reduction sensitization and noble metal sensitization have been known. Any of them may be used alone, and they can be combined for chemical sensitization. They have been described in, for example, P. Glafkides, *Chimie et Physique Photographique,* Paul Montel, Paris (1967); V. L. Zelikman et al., *Making and Coating Photographic Emulsion,* The Focal Press, London (1964); and H. Frieser, *Die Grundlagen der Photographischen Prozesse mit Silberhalogeniden,* pp. 675–734 (Akademische Verlagsgesellschaft, 1968).

In noble metal sensitization, gold sensitization is a typical method, wherein gold compounds, chiefly, gold complex salts are used. Complex salts of noble metal other than gold, for example, platinum, palladium, iridium, etc., may be used. Examples of them have been described in U.S. Pat. No. 2,448,060 and British Patent No. 618.061.

As sulfur sensitizers, it is possible to use not only sulfur compounds contained in gelatin but also various sulfur compounds, for example, thiosulfates, thioureas, thiazoles, rhodanines, etc. Examples of them are those described in U.S. Pat. Nos. 1,574,944, 2,278,947, 2,410,689, 2,728,668, 3,501,313 and 3,656,955.

As reduction sensitizers, it is possible to use stannous salts, amines, formamidine-sulfinic acid, silane compounds, examples of which have been described in U.S. Pat. Nos. 2,487,850, 2,518,698, 2,983,609, 2,983,610 and 2,694,637.

The light-sensitive materials of the present invention may contain various compounds for the purpose of preventing fog in the process of preparation, during preservation or during photographic processing of the light-sensitive materials or stabilizing photographic performances. Namely, it is possible to add various compounds known as antifoggants or stabilizers such as azoles, for example, benzothiazolium salts, nitroindazoles, nitrobenzimidazoles, chlorobenzimidazoles, bromobenzimidazoles, mercaptothiazoles, mercaptobenzothiazoles, mercaptobenzimidazoles, mercaptothiadiazoles, aminotriazoles, benzothiazoles, nitrobgenzotriazoles, mercaptotetrazoles (particularly, 1-phenyl-5-mercaptotetrazole), etc.; mercaptopyrimidines; mercaptotriazines; thioketo compounds such as oxazolinethione; azaindenes, for example, triazaindenes, tetraazaindenes (particularly, 4-hydroxy substituted (1,3,3a,7)tetraazaindenes), pentaazaindenes, etc.; benzenethiosulfonic acid, benzenesulfinic acid, benzenesulfonic acid amide, etc. Of these compounds, benzotriazoles (for example, 5-methylbenzotriazole) and nitroindazoles (for example, 5-nitroindazole) are particularly suitable. These compounds may be incorporated in processing solutions.

The light-sensitive materials used in the present invention may contain sensitizing dyes described in Japanese Patent Application (OPI) No. 52050/80 (corresponding to U.S. Pat. No. 4,243,739), pages 45–53 (for example, cyanine dyes, merocyanaine dyes, etc., which may be used alone or in combination), supersensitizers (for example, aminostilbene compounds, aromatic organic acidformaldehyde condensates, cadmium salts, azaindene compound, etc.), water-soluble dyes (for the purpose of using as a filter or preventing irradiation; for example, oxonol dyes, hemioxonol dyes, merocyanine dyes, etc.), hardeners (for example, chromium salts, aldehyde salts, N-methylol compounds, dioxane derivatives, active vinyl compounds, active halogen compounds, etc.), surface active agents (for example, known various nonionic, anionic, cationic and ampholytic surface active agents; polyoxyalkylenes described in Japanese Patent Application (OPI) No. 37732/79 (corresponding to U.S. Pat. No. 4,221,857) are particularly useful), etc.

Polyalkylene oxides or derivatives suitably used in the present invention have a molecular weight of at least 600. The polyalkylene oxides or derivatives thereof may be incorporated in the silver halide light-sensitive material or may be incorporated in the developing solution.

Polyalkylene oxide compounds used in the present invention include condensation products of polyalkylene oxide composed of at least 10 alkylene oxide units having 2 to 4 carbon atoms such as ethylene oxide, propylene-1,2-oxide, or butylene-1,2-oxide, etc., preferably ethylene oxide, and a compound having at least one active hydrogen atom, such as water, aliphatic alcohol, aromatic alcohol, aliphatic acid, organic amine or hexitol derivatives, etc., or block copolymers composed of two or more polyalkylene oxides.

Namely, as the polyalkylene oxide compounds, it is possible to use polyalkylene glycols, polyalkylene glycol alkyl ethers, polyalkylene glycol aryl ethers, polyalkylene glycol (alkylaryl) ethers, polyalkylene glycol esters, polyalkylene glycol aliphatic acid amides, polyalkylene glycol amines, polyalkylene glycol block copolymers, polyalkylene glycol graft polymers, etc.

The molecule does not always contain only one polyalkylene oxide chain, but two or more polyalkylene oxide chains may be contained. In the latter case, each polyalkylene oxide chain may be composed of less than 10 alkylene oxide units, but a total of alkylene oxide units in the molecule should be at least 10. In the case that the molecule has two or more polyalkylene oxide chains, they may be composed of different alkylene oxide units one another, for example, ethylene oxide and propylene oxide. Polyalkylene oxide compounds capable of being suitably used in the present invention are those containing 14 to 100 alkylene oxide units.

The light-sensitive materials used in the present invention may contain a water-insoluble or sparingly water-soluble synthetic polymer dispersion for the purpose of improving dimensional stability. For example, it is possible to use polymers composed of one or more of alkyl acrylate (methacrylate), alkoxyalkyl acrylate (methacrylate), glycidyl acrylate (methacrylate), acrylamide (methacrylamide), vinyl ester (for example, vinyl acetate), acrylonitrile, olefin, styrene, etc., or polymers composed of the above-described monomer and acrylic acid, methacrylic acid, $\alpha,\beta$-unsaturated dicarboxylic acid, hydroxyalkyl acrylate (methacrylate), suloalkyl acrylate (methacrylate) or styrenesulfonic acid. For example, it is possible to use those described in U.S. Pat. Nos. 2,376,005, 2,739,137, 2,853,457, 3,062,674, 3,411,911, 3,488,708, 3,525,620, 3,607,290, 3,635,715 and 3,645,740, and British Patent Nos. 1,186,699 and 1,307,373. The hard tone emulsions in the present invention are suitable for reproduciton of line drawings. Accordingly, it is preferred to contain such a polymer dispersion, because dimensional stability is important for the above-described use.

The present invention is illustrated in greater detail with reference to the following non-limiting examples.

EXAMPLE 1

A silver chlorobromide emulsion of 0.3 μm containing rhodium was prepared. After soluble salts were removed from the emulsion by a conventional manner, the emulsion was chemically sensitized by adding sodium thiosulfate and potassium chloroaurate. This emulsion had a composition of 70% by mol of silver chloride and 30% by mol of silver bromide and contained rhodium in an amount of $5\times10^{-6}$ mol/mol of silver. To this emulsion, 1-formyl-{2,4-[2-(2,4-di-t-pentylphenoxy)butyramido] phenyl}hydrazide (II-9) was added as the compound represented by the general formula (II) in an amount of $1\times10^{-3}$ mol per mol of silver, and 3-ethyl-5-[2-(3-ethyl-2(3H)-thiazolinylidene-ethylidene)rhodamine was added as a sensitizing dye. After 5-methylbenzotriazole, 4-hydroxy-6-methyl-1,3,3a,7-tetraazaindene, a dispersion of polyethyl acrylate and 2-hydroxy-4,6-dichloro-1,3,5-triazine sodium salt was added, the emulsion was applied to a cellulose triacetate film so as to result in a silver amount of 4 $g/m^2$.

After the resulting film was exposed to light through an exposure wedge for sensitometry using a 150-line magenta contact screen, it was developed at 38° C. for 20 seconds with Developing Solutions A to C having the following compositions, followed by fixing, washing with water and drying (these processings were carried out using an automatic developing apparatus FG 660F produced by Fuji Photo Film Co., Ltd.).

The photographic performances in the case of processing with a developing solution just after preparation (fresh solution) and those in the case of processing with a developing solution which was allowed to stand in a development tank of the above-described automatic developing apparatus for 4 days after preparation (without being used for processing the film) were compared in Table 1.

In order to compare silver pollution of each developing solution, using full sized films (50.8 cm×61.0 cm) the whole surface of which was exposed to light, and unexposed films, in a ratio of 1:1, running processing of 1,000 films were carried out in such a manner that every 200 films per day were processed for 5 days. In this case, the Developing Solutions A, B and C were supplied in an amount of every 100 ml, respectively, each time one full sized film was processed. After conclusion of running processing of 1,000 films, an unexposed film having a size of 9.0 cm×25 cm was processed, and the degree of silver pollution on the film was examined. The results are shown in Table 1.

Developing Solution A

| | |
|---|---|
| Hydroquinone | 40.0 g |
| 4-Hydroxymethyl-4-methyl-1-phenyl-3-pyrazolidone | 0.4 g |
| Sodium Sulfite | 75.0 g |
| Sodium Hydrogencarbonate | 7.0 g |
| Disodium Ethylenediaminetetraacetate | 1.0 g |
| Potassium Bromide | 3.5 g |
| 5-Methylbenzotriazole | 0.8 g |
| Water to make | 1 liter |
| pH was adjusted to 12.0 with potassium hydroxide. | |

Developing Solution B

That which was prepared by adding 3-diethylamino-1propanol to the Developing Solution A in an amount of 45 g per liter (0.34 mol/l), the pH of which was adjusted to 11.4.

Developing Solution C

That which was prepared by adding the exemplified Compound (I-2) represented by the general formula (I) of the present invention to Developing Solution A in an amount of 1.0 g per liter (0.004 mol/l), the pH of which was adjusted to 11.4.

In Table 1, photographic sensitivity was presented as a relative value of a reciprocal of an exposure amount of giving a black density 1.5, which was based on the value of the fresh solution of Developing Solution A being 100. The quality of halftone was visually evaluated in 5 grades, wherein (5) means the best quality of halftone and (1) means the worst quality of halftone. As a halftone base plate for plate making, the cases of (5) and (4) are practically used, the case of (3) is poor but can be barely practically used, and the cases of (2) and (1) cannot be practically used.

Silver pollution was evaluated in 5 grades, wherein (5) means the state that pollution was not generated at all on a film having a size of 9.0×25.0 cm, and (1) means the state that silver pollution was generated on the entire face of the film. (4) means an allowable level for practical use, though silver pollution is generated on a very small part. (3), (2) and (1) mean each a state of not practical use.

TABLE 1

| Developing Solution Used | Fresh Solution | | After Passage of 4 Days | | |
|---|---|---|---|---|---|
| | Photographic Sensitivity | Quality of Halftone | Photographic Sensitivity | Quality of halftone | Silver Pollution of Film |
| Developing Solution A pH: 12.0 (Control) | 100 | 5 | 120 | 4 | 5 |
| Developing Solution B pH: 11.4 (Comparison) | 100 | 5 | 100 | 5 | 2 |
| Developing Solution C pH: 11.4 (The Present Invention) | 100 | 5 | 100 | 5 | 5 |

It is understood that Developing Solutions A to C show a quality of halftone of 4 to 5 and give gradation of superhard tone.

Developing Solution B has advantageous photographic characteristics equal to those obtained with Developing Solution A but which can be attained at a lower pH value, because a large amount of the amino compound is added, and stability to passage of time is higher than the case of Developing solution A, because the pH value is low. However, trouble of silver pollution is generated, when a large quantities of films are processed.

On the contrary, in Developing Solution C of the present invention, since the specific amino compound represented by the general formula (I) is used, silver pollution does not occur, even if a large quantities of films are processed, and good sensitization and hard toning functions are realized at a low pH value, and it has an effect of being stable over the passage of time.

When Compounds I-1 and I-3 to I-8 exemplified in this specification were used in place of Compound I-2, nearly the same effects as those in the case of Developing Solution C were obtained.

While the invention has been described in detail and with reference to specific embodiments thereof, it will be apparent to one skilled in the art that various changes and modifications can be made therein without departing from the spirit and scope thereof.

What is claimed is:

1. A process for high contrast development of a silver halide photographic light-sensitive material comprising developing an imagewise exposed negative type silver halide photographic light-sensitive material in the presence of hydrazine, using a developing solution comprising(1) a developing agent, (2) 0.25 mol/l or more of sulfite and (3) a compound represented by the general formula (I) and having a pH value of 10.5 to 12.3:

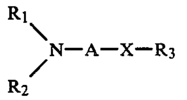

(I)

wherein $R_1$ and $R_2$ each represent a substituted or unsubstituted alkyl group or $R_1$ and $R_2$ form a ring by linking to each other, $R_3$ represents a substituted or unsubstituted alkyl group, a substituted or unsubstituted aryl group or a substituted or unsubstituted heterocyclic groups, A represents a substituted or unsubstituted alkylene group, and X represents —CONH—, —OCONH—, —NHCONH—, —NHCOO—, —COO—, —OCO—, —CO—, —NHCO—, —$SO_2$NH—, —$NHSO_2$—or —O—.

2. The process as claimed in claim 1, wherein the compound represented by the general formula (I) is employed in the amount of 0.1 g to 10 g per liter of developing solution.

3. The process as claimed in claim 2, wherein the compound represented by the general formula (I) is employed in the amount of 0.5 to 3 g per liter of developing solution.

4. The process as claimed in claim 1, wherein said developing agent is employed in the amount of 0.05 mol/l to 0.8 mol/l.

5. The process as claimed in claim 1, wherein said sulfite is employed in the amount of from 0.3 mol/l to 1.2 mols/l.

6. The process as claimed in claim 1, wherein said hydrazine is employed in the developing solution in a range of 5 mg/l to 5 g/l.

7. The process as claimed in claim 6, wherein said hydrazine is employed in the developing solution in a range of 10 mg/l to 1 g/l.

8. The process as claimed in claim 1, wherein said hydrazine is added to the light-sensitive material in a range of $10^{-6}$ mol to $5\times10^{-2}$ mol per mol of silver.

9. The process as claimed in claim 8, wherein said hydrazine is added to the light-sensitive material in a range of $10^{-5}$ to $2\times10^{-2}$ mol per mol of silver.

10. The process as claimed in claim 1, wherein said hydrazine is represented by the general formula (II):

$$R^4\text{—NH—NH—G—}R^5 \quad \text{(II)}$$

wherein $R^4$ represents an aliphatic group or an aromatic group, $R^5$ represents a hydrogen atom, a substituted or unsubstituted alkyl group, a substituted or unsubstituted aryl group, a substituted or unsubstituted alkoxy group or a substituted or unsubstituted aryloxy group and G represents a carbonyl group, a sulfonyl group, a sulfoxy group, a phosphoryl group or an N-substituted or unsubstituted iminomethylene group.

11. The process as claimed in claim 1, wherein said developing agent comprises a dihydroxybenzene.

12. The process as claimed in claim 11, wherein said developing agent further comprises a 1-phenyl-3-pyrazolidone.

13. The process as claimed in claim 11, wherein said dihydroxybenzene is selected from the group consisting of hydroquinone, chlorohydroquinone, bromohydroquinone, isopropylhydroquinone, methylhydroquinone, 2,3-dichlorohydroquinone, 2,5-dichlorohydroquinone, 2,3-dibromohydroquinone and 2,5-dimethylhydroquinone.

14. The process as claimed in claim 11, wherein said dihydroxybenzene is hydroquinone.

15. The process as claimed in claim 13, wherein said 1-phenyl-3-pyrazolidone is selected from the group consisting of 1-phenyl-3-pyrazolidone, 1-phenyl-4,4-dimethyl-3-pyrazolidone, 1-phenyl-4-methyl-4-hydroxymethyl-3-pyrazolidone, 1-phenyl-4,4-dihydroxymethyl-3-pyrazolidone, 1-phenyl-5-methyl-3-pyrazolidone, 1-p-aminophenyl-4,4-dimethyl-3-pyrazolidone and 1-p-tolyl-4,4-dimethyl-3-pyrazolidone.

16. The process as claimed in claim 11, wherein the developing agent is used in an amount of 0.05 mol/l to 0.8 mol/l.

17. The process as claimed in claim 12, wherein said dihydroxybenzene is used in an amount of 0.05 mol/l to 0.5 mol/l and the 1-phenyl-3-pyrazolidone is used in an amount of 0.06 mol/l or less.

* * * * *